US006566177B1

(12) United States Patent
Radens et al.

(10) Patent No.: US 6,566,177 B1
(45) Date of Patent: May 20, 2003

(54) SILICON-ON-INSULATOR VERTICAL ARRAY DEVICE TRENCH CAPACITOR DRAM

(75) Inventors: Carl J. Radens, LaGrangeville; Gary B. Bronner, Stormville; Tze-chiang Chen, Yorktown Heights; Bijan Davari, Mahopac; Jack A. Mandelman, Stormville, all of NY (US); Dan Moy, Bethel, CT (US); Devendra K. Sadana, Pleasantville, NY (US); Ghavam Ghavami Shahidi, Yorktown Heights, NY (US); Scott R. Stiffler, Amenia, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,257

(22) Filed: Oct. 25, 1999

(51) Int. Cl.$^7$ ............................................. H01L 21/00
(52) U.S. Cl. ...................... 438/152; 438/388; 438/392
(58) Field of Search ................. 438/152, 388, 438/392, 305, 243, 244, 245, 246, 247, 248, 624, 633, 688, 669; 257/301, 302, 303, 304, 752, 753, 758

(56) References Cited

U.S. PATENT DOCUMENTS

| | | | |
|---|---|---|---|
| 4,673,962 A | 6/1987 | Chatterjee et al. | |
| 5,006,909 A | 4/1991 | Kosa et al. | |
| 5,065,273 A | * 11/1991 | Rajeevakumar | ............. 361/313 |
| 5,102,817 A | 4/1992 | Chatterjee et al. | |
| 5,164,917 A | 11/1992 | Shichijo et al. | |
| 5,208,657 A | 5/1993 | Chatterjee et al. | |
| 5,225,697 A | 7/1993 | Malhi et al. | |
| 5,252,845 A | 10/1993 | Kim et al. | |
| 5,281,837 A | 1/1994 | Kobyama et al. | |
| 5,300,450 A | 4/1994 | Shen et al. | |
| 5,334,548 A | 8/1994 | Shen et al. | |
| 5,362,665 A | 11/1994 | Lu et al. | |
| 5,369,049 A | * 11/1994 | Acocella et al. | ............... 437/52 |
| 5,384,277 A | * 1/1995 | Hsu et al. | ....................... 437/52 |
| 5,389,559 A | * 2/1995 | Hsieh et al. | ................... 437/52 |
| 5,422,289 A | * 6/1995 | Pierce | ........................... 437/32 |
| 5,504,357 A | 4/1996 | Kim et al. | |
| 5,627,092 A | * 5/1997 | Alsmeier et al. | ............ 438/152 |
| 5,710,056 A | 1/1998 | Hsu et al. | |
| 5,888,864 A | 3/1999 | Koh et al. | |
| 5,909,044 A | * 6/1999 | Chakravarti et al. | ......... 257/301 |

(List continued on next page.)

FOREIGN PATENT DOCUMENTS

JP            02000269494        * 9/2000       ................... 27/108

*Primary Examiner*—Olik Chaudhuri
*Assistant Examiner*—Laura Schillinger
(74) *Attorney, Agent, or Firm*—H. Daniel Schnurmann

(57) ABSTRACT

A silicon on insulator (SOI) dynamic random access memory (DRAM) cell and array and method of manufacture. The memory cell includes a trench storage capacitor connected by a self aligned buried strap to a vertical access transistor. A buried oxide layer isolates an SOI layer from a silicon substrate. The trench capacitor is formed in the substrate and the access transistor is formed on a sidewall of the SOI layer. A polysilicon strap connected to the polysilicon plate of the storage capacitor provides a self-aligned contact to the source of the access transistor. Initially, the buried oxide layer is formed in the wafer. Deep trenches are etched, initially just through the SOI layer and the BOX layer. Protective sidewalls are formed in the trenches. Then, the deep trenches are etched into the substrate. The volume in the substrate is expanded to form a bottle shaped trench. A polysilicon capacitor plate is formed in the deep trenches and conductive polysilicon straps are formed in the trenches between the capacitor plates and the SOI sidewalls. Device regions are defined in the wafer and a sidewall gate is formed in the deep trenches. Shallow trenches isolation (STI) is used to isolate and define cells. Bitlines and wordlines are formed on the wafer.

9 Claims, 12 Drawing Sheets

U.S. PATENT DOCUMENTS

| | | | |
|---|---|---|---|
| 6,091,094 A | * 7/2000 | Rupp | 257/296 |
| 6,180,509 B1 | * 1/2001 | Huang et al. | 438/624 |
| 6,190,971 B1 | * 2/2001 | Gruening et al. | 438/270 |
| 6,191,484 B1 | * 2/2001 | Huang et al. | 257/752 |
| 6,204,112 B1 | * 3/2001 | Chakravarti et al. | 438/243 |
| 6,211,008 B1 | * 4/2001 | Yu et al. | 438/253 |

* cited by examiner

SILICON-ON-INSULATOR VERTICAL ARRAY DEVICE TRENCH CAPACITOR DRAM

BACKGROUND OF THE INVENTION

1. Field of the Invention

The present invention generally relates to semiconductor memories and, more particularly, to a trench capacitor dynamic random access memory cell with a vertical silicon on insulator access transistor for semiconductor memories.

2. Background Description

Dynamic Random Access Memory (DRAM) cells are well known. A DRAM cell is essentially a capacitor for storing charge and a pass transistor (also called a pass gate or access transistor) for transferring charge to and from the capacitor. Data (1 bit) stored in the cell is determined by the absence or presence of charge on the storage capacitor. Because cell size determines chip density, size and cost, reducing cell area is one of the DRAM designer's primary goals. Reducing cell area is done, normally, by reducing feature size to shrink the cell.

Besides shrinking the cell features, the most effective way to reduce cell area is to reduce the largest feature in the cell, typically, the area of the storage capacitor. Unfortunately, shrinking the capacitor plate area reduces capacitance and, consequently, reduces stored charge. Reduced charge means that what charge is stored in the DRAM is more susceptible to noise, soft errors, leakage and other well known DRAM problems. Consequently, another primary goal for DRAM cell designers is to maintain storage capacitance while reducing cell area.

One way to accomplish this density goal without sacrificing storage capacitance is to use trench capacitors in the cells. Typically, trench capacitors are formed by etching long deep trenches in a silicon wafer and, then, placing each capacitor on its side in the trench, orienting the capacitors vertically with respect to the chip's surface. Thus, the surface area required for the storage capacitor is dramatically reduced without sacrificing capacitance, and correspondingly, storable charge.

However, since using a trench capacitor eliminates much of the cell surface area, i.e., that portion of cell area which was formerly required for the storage capacitor, the cell's access transistor has become the dominant cell feature determining array area. As a result, to further reduce cell and array area, efforts have been made to reduce access transistor area, which include making a vertical access transistor in the capacitor trench. See, for example, U.S. Pat. No. 5,006,909 entitled "DRAM With A Vertical Capacitor And Transistor" to Kosa.

Other approaches to using a vertical access transistor include U.S. Pat. No. 4,673,962 entitled "Vertical DRAM Cell and Method" to Chatterjee et al. and U.S. Pat. No. 5,102,817 entitled "Vertical DRAM Cell and Method" to Chatterjee et al. which both teach a vertical DRAM cell with a polysilicon channel access transistor. The polysilicon channel access transistor is formed in the same vertical polysilicon layer that serves as the cell storage capacitor plate.

U.S. Pat. No. 5,164,917 entitled "Vertical One-transistor DRAM With Enhanced Capacitance And Process for Fabricating" to Shichijo, U.S. Pat. No. 5,208,657 entitled "DRAM Cell With Trench Capacitor And Vertical Channel in Substrate" to Chatterjee et al., U.S. Pat. No. 5,225,697 entitled "Vertical DRAM Cell and Method" to Malhi et al. and U.S. Pat. No. 5,252,845 entitled "Trench DRAM Cell With Vertical Transistor" to Kim et al. all teach memory cells formed in small square deep trenches that have vertical access transistors. Further, the access transistor is annular, essentially, and formed on the trench sidewalls above the cell trench capacitor. Both Kim et al. and Shichijo teach DRAM cells wherein a layered storage capacitor is formed in and entirely enclosed in the trench.

For another approach, U.S. Pat. No. 5,103,276 entitled "High Performance Composed Pillar DRAM Cell" to Shen et al., U.S. Pat. No. 5,300,450 entitled "High Performance Composed Pillar DRAM Cell" to Shen et al. and U.S. Pat. No. 5,334,548 entitled "High Performance Composed Pillar DRAM Cell" to Shen et al. teach etching a grid-like pattern to form individual pillars. A common capacitor plate is formed at the bottom of the pillars. A diffusion on all sides of the bottom of the cell pillar serves as a cell storage node. Each pillar's storage diffusion is isolated from adjacent pillars by a dielectric pocket formed beneath the common capacitor plate. An access transistor channel is along one side of each pillar and disposed between the storage node and a bitline diffusion, which is at the top of the pillar. The access transistor gate is formed on one side of the pillar, above the common capacitor plate.

U.S. Pat. No. 5,281,837 entitled "Semiconductor Memory Device Having Cross-Point DRAM Cell Structure" to Kohyama, U.S. Pat. No. 5,362,665 entitled "Method of Making Vertical DRAM Cross-Point Memory Cell" to Lu and U.S. Pat. No. 5,710,056 entitled "DRAM With a Vertical Channel Structure And Process For Manufacturing The Same" to Hsu teach yet another approach wherein DRAM cells have their storage capacitor formed above the access transistor. U.S. Pat. No. 5,504,357 entitled "Dynamic Random Access Memory having A Vertical Transistor" to Kim et al. teaches a buried bitline transistor with the bitline formed at the bottom of a trench and the storage capacitor is formed above the transistor, at the wafer surface.

Performance is equally as important as density to DRAM design. Silicon-on-insulator (SOI) has be used to decrease parasitic capacitance and hence to improve integrated circuit chip performance. SOI reduces parasitic capacitance within the integrated circuit to reduce individual circuit loads, thereby improving circuit and chip performance. However, reducing parasitic capacitance is at odds with increasing or maintaining cell storage capacitance. Accordingly, SOI is seldom used for DRAM manufacture. One attempt at using SOI for DRAMS is taught in U.S. Pat. No. 5,888,864 entitled "Manufacturing Method of DRAM Cell Formed on An Insulating Layer Having a Vertical Channel" to Koh et al. Koh et al. teaches a SOI DRAM formed in a dual sided wafer circuit fabrication process. In the dual sided wafer fabrication process of Koh et al. storage capacitors are formed on one side of the wafer and, the access transistors are formed on the other side of the wafer.

Thus, there is a need for increasing the number of stored data bits per chip of Dynamic Random Access Memory (DRAM) products. There is also a need for improving DRAM electrical performance without impairing cell charge storage.

SUMMARY OF THE INVENTION

It is therefore a purpose of the present invention to increase the Dynamic Random Access Memory (DRAM) integration packing density;

It is another purpose of the present invention to decrease DRAM cell area;

It is yet another purpose of the present invention to increase the number of bits per DRAM chip;

It is yet another purpose of the present invention to reduce parasitic capacitance within DRAM chips;

It is yet another purpose of the present invention to improve DRAM electrical performance;

It is yet another purpose of the invention to achieve trench capacitor DRAM cell density while benefitting from the reduced parasitic capacitance, leakage and improved performance of silicon on insulator technology.

The present invention is a vertical trench-capacitor Dynamic Random Access Memory (DRAM) cell and array in a Silicon-On-Insulator (SOI) substrate and an SOI DRAM chip. The cell has a vertical trench capacitor and an insulated gate Field Effect Transistor (FET) formed on the trench sidewall. A buried oxide layer (BOX) in the SOI substrate forms a protective sidewall collar along the upper edge of the capacitor region. The vertical FET is formed along the upper sidewall of the trench, above the trench capacitor. A polysilicon strap formed along the sidewall at the BOX layer forms a self-aligned contact between the trench capacitor and the vertical FET. Thus, the cell occupies less horizontal chip area than a conventional planar DRAM cell.

The cells are formed in a silicon wafer by first forming the buried oxide layer in the wafer. Deep trenches are etched, initially, through the SOI layer and the BOX layer and protective sidewalls are formed. Then, the deep trenches are etched into the substrate. The trench volume in the substrate is expanded to form a bottle shaped trench. A polysilicon capacitor plate is formed in the deep trenches. Conductive polysilicon straps are formed in the trenches between the capacitor plates and the SOI layer sidewalls. Device regions are defined and a sidewall transistor gate is formed in the deep trenches. Shallow trenches isolation (STI) is used to isolate and define cells. Bitlines and wordlines are formed.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1:
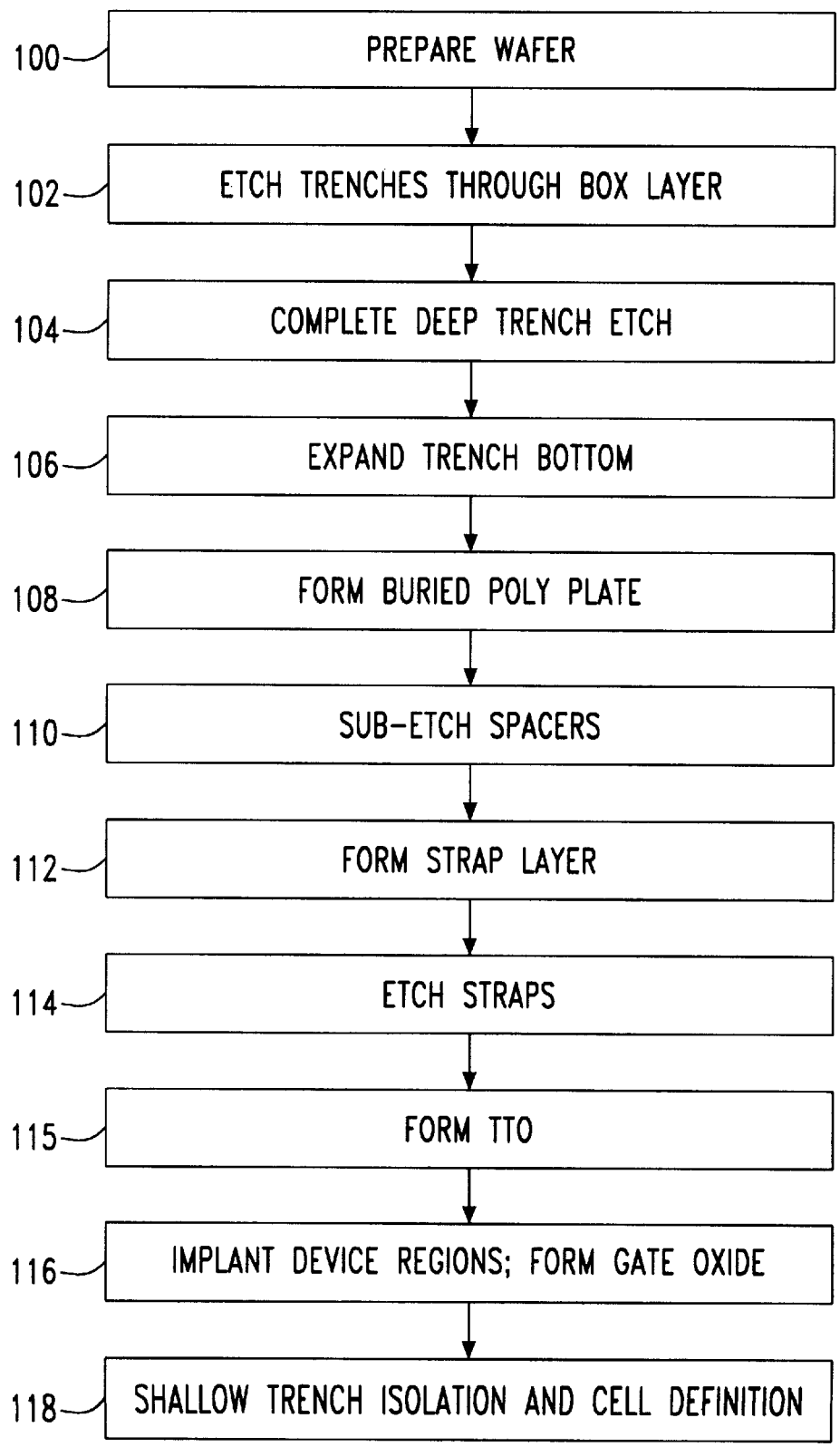
FIG. 1 is a flow diagram of the preferred embodiment process for forming a vertical DRAM cell.

Referring now to the drawings, and more particularly, FIG. 1 shows a flow diagram of the preferred embodiment silicon-on-insulator (SOI) process for forming vertical DRAM cells. First, if a SOI wafer has not been previously prepared, then, in step 100, the SOI wafer is prepared from a semiconductor wafer. Preferably, the initial wafer is a single crystal silicon wafer. A buried oxide (BOX) layer is formed in the silicon wafer. The BOX layer isolates a silicon layer (SOI layer) above the BOX layer from a thick substrate below the BOX layer, which is much thicker than the silicon layer. Then, in step 102 a deep trench location pattern is formed, preferably, using a typical photolithographic process. Deep trenches are partially etched into the wafer, etching through the silicon layer and the BOX layer down to the thicker substrate. A protective spacer is formed along the sidewalls of the partially etched trenches to protect the SOI layer sidewalls. In step 104 the deep trenches are completed, etching into the thick substrate to the full trench depth. Then, in step 106, the trench volume is expanded below the BOX layer to form bottle shaped trenches.

The trench capacitor formation begins in step 108 by forming a buried capacitor plate in the expanded portion of the bottle shaped trench. Then, in step 110, the upper portion of the protective sidewall spacers are removed, along the SOI layer, and the spacers are recessed (but not removed) below the upper surface of the buried plate. In step 112 a conformal strap layer is formed filling the recesses. The strap layer forms a conductive strap between the capacitor plate and the silicon layer sidewall. In step 114 the straps are defined when excess strap material is removed, preferably using an appropriate well known photolithographic process. In step 115 oxide is formed on top of the capacitor plate, i.e., trench top oxide (TTO). In step 116 the wafer is implanted to define n-wells, p-wells and a buried n-type region (n-band) that couples the storage capacitors' reference plates (i.e., the substrate sidewall) in common. A gate oxide is grown on the sidewalls. The trenches are filled with gate conductor material, in step 118 and shallow trenches are formed which define isolated silicon islands of the SOI layer. Also, the shallow trenches isolate cells on the islands from cells on adjacent islands. Wordline and bitline formation complete cell formation.

FIGS. 2A–J illustrate the steps of the process of forming a vertical DPAM cell in a deep trench 120 in an SOI wafer according to the steps of FIG. 1. As noted above, the BOX layer 122 is formed in a single crystal silicon wafer. The BOX layer 122 separates the surface SOI silicon layer 124 from the remaining thicker silicon substrate 126. Preferably, the BOX layer 122 is formed using a high-dose oxygen ion implantation in the single crystal wafer. However, any other suitable SOI technique may be employed. The preferred BOX layer 122 thickness is 300 nm, but the BOX layer 122 may be 10 nm to 500 nm thick. Further, BOX layer 122 thickness may be selected by adjusting ion implantation dose and energy. The SOI surface layer 124, preferably, is 500 nm thick. However, depending on the desired cell access transistor channel length, the SOI layer 124 may be 100 nm to 1000 nm thick. The SOI layer 124 thickness may be adjusted using a combination of chemical vapor deposition (CVD) epitaxial growth and/or etching and polishing. Having thus prepared the layered SOI wafer, memory cells may be formed according to the present invention.

A pad layer 128 of an insulating material such as silicon nitride (SiN) is formed on the upper surface 130 of silicon layer 124. The pad layer 128 may be formed using, for example, low-pressure CVD (LPCVD) depositing SiN to a thickness of 10 nm to 500 nm, preferably 200 nm. Optionally, prior to forming the pad LPCVD SiN layer 128, a thin (2 nm to 10 nm, preferably 5 nm) thermal oxide layer (not shown) may be formed on the SOI silicon layer 124.

Cell locations 120 are identified as deep trenches are patterned and opened, initially, through the SOI layer 124 and BOX layer 122 in step 102. A hard mask layer 132 of a suitable masking material such as silicon dioxide is deposited on pad layer 128 to a thickness of 100 nm to 2000 nm, preferably 1000 nm. The hard mask layer 132 is patterned using a conventional photolithography technique. Then, deep trenches 120 are defined and partially formed using an anisotropic dry etch technique, such as a Reactive Ion Etch (RIE), etching through pad layer 128, silicon layer 124, BOX layer 122 and stopping at the silicon substrate 126. Optionally, the mask pattern may be opened with the same RIE used to partially open the trenches 120.

Sidewall spacers 134 are formed along sidewalls 136, 138. A thin insulator layer, preferably SiN, is conformally deposited (LPCVD) and then anisotropically dry etched, preferably using RIE. Sidewall spacers 134 protect the trench sidewalls of SOI layer 124 and BOX layer 122 during subsequent processing steps.

Figure 2A:
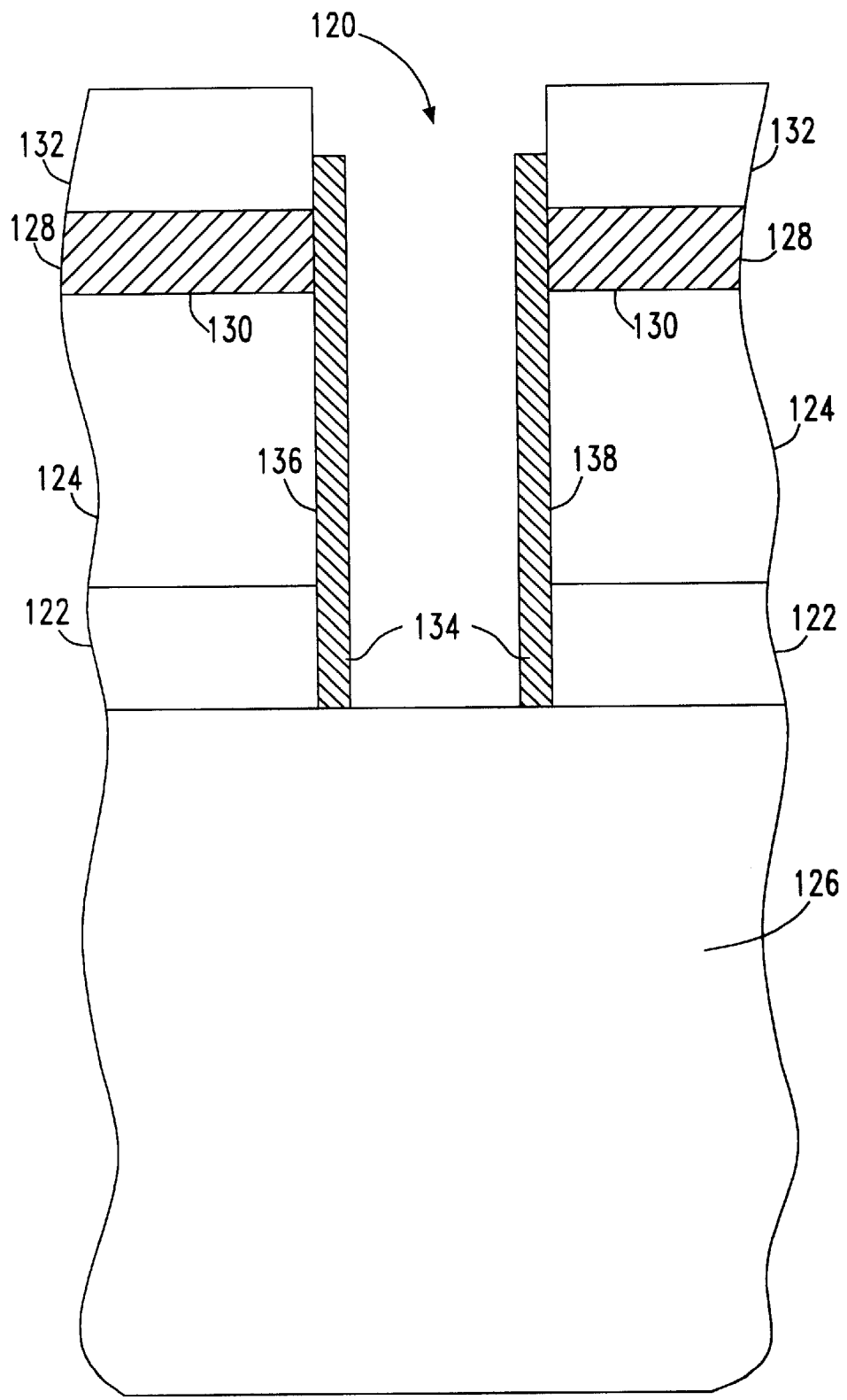
FIGS. 2A–J illustrate the steps of the process of forming vertical DRAM cells according to FIG. 1.
Figure 2B:
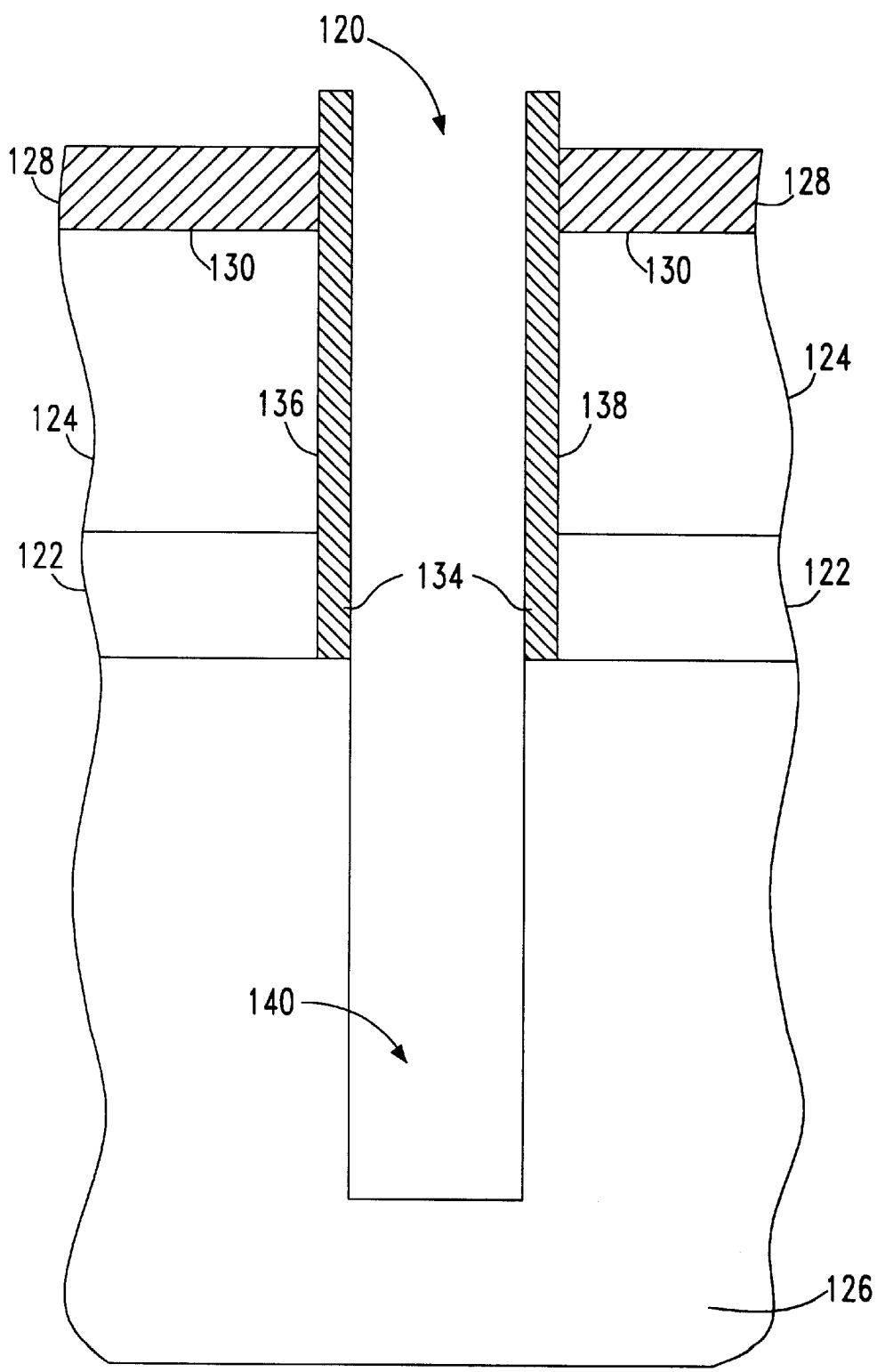

In FIG. 2B, the deep trenches 120 are completed, etching lower area 140 into substrate 126 in step 104. Preferably RIE is used to etch the trenches 120 to their full depth of 3 μm to 10 μm, preferably 6 μm. Then, the hard mask 132 is removed, preferably, using a hydrofluoric acid solution. As intended, the sidewall spacers 134 protect the silicon layer 126 trench sidewalls 136, 138 and the BOX layer 122 trench sidewalls.

Figure 2C:
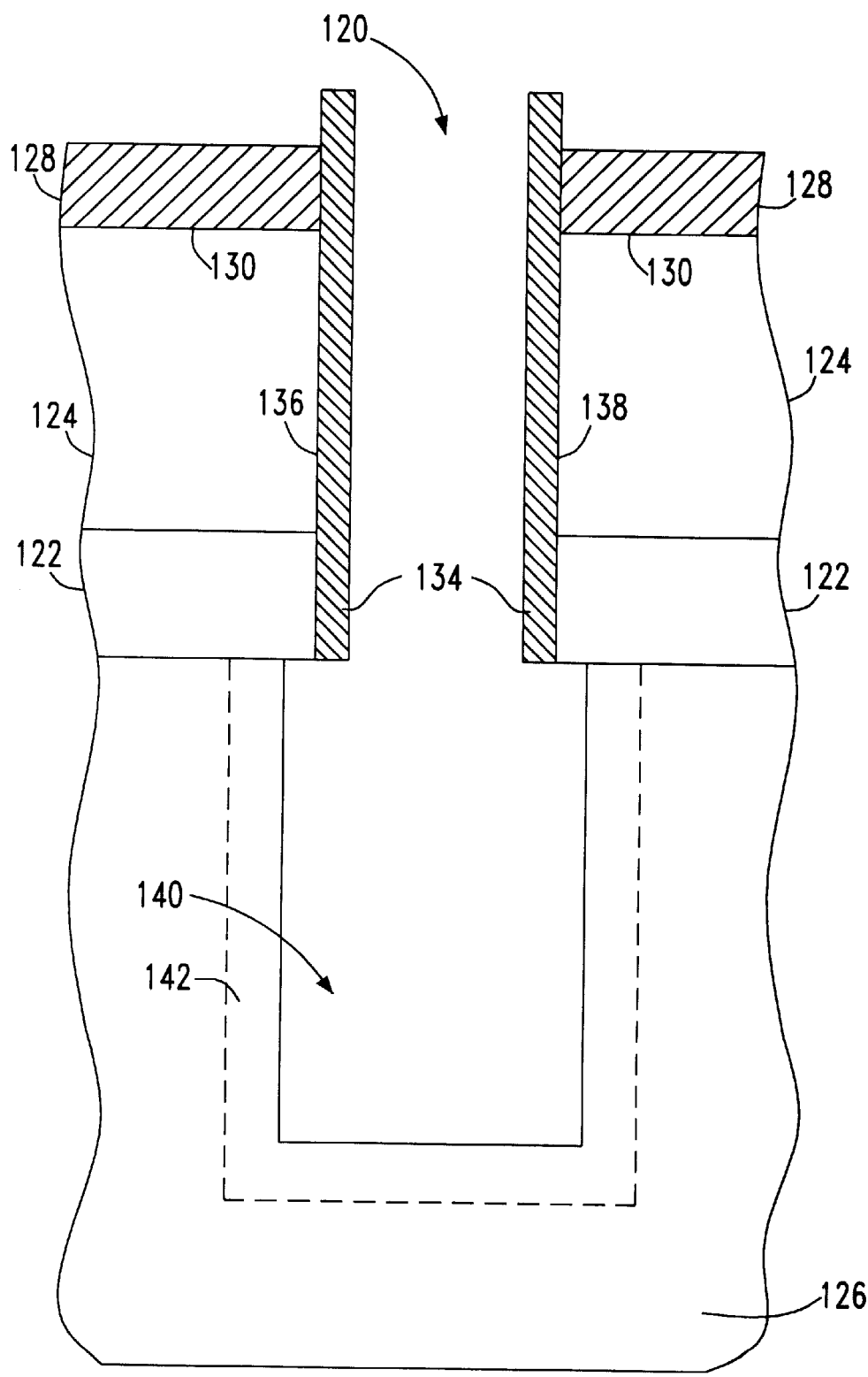

In FIG. 2C the lower region 140 of the trench 120 is enlarged to form a trench with a bottle shaped cross section in step 106. A suitable wet or dry etch process is used to etch away exposed substrate silicon from the sidewalls in the lower region 140. Again, the SOI layer 124 remains protected by the sidewall spacers 134, BOX 122 and pad film 128. The extent of substrate silicon removed in this lower trench area 140 is limited laterally by the selected array cell spacing and, preferably, is such that the trench is expanded in this lower area 140 by less than 30% of the distance to the nearest neighboring trench. Thus, the substrate thickness between neighboring trench sidewalls in this lower area 140 is >70% of the trench 120 separation at the surface. Optionally, at this point, the exposed substrate in the lower trench area 140 may be doped to form a common capacitor plate 142. If doped, the lower trench area 140 is doped with an n-type dopant to a concentration of $10^{18}$–$10^{19}$ using a gas-phase doping or other suitable doping techniques.

It should be noted that the preferred embodiment described herein is described with device regions being doped for a particular device type, i.e., n-type FET (NFET). The selected device type described herein is for example only and not intended as a limitation. A person of ordinary skill would understand how to replace NFETs with p-type FETs (PFETs) and n-type dopant with p-type dopant where appropriate without departing from the spirit or scope of the invention.

Figure 2D:
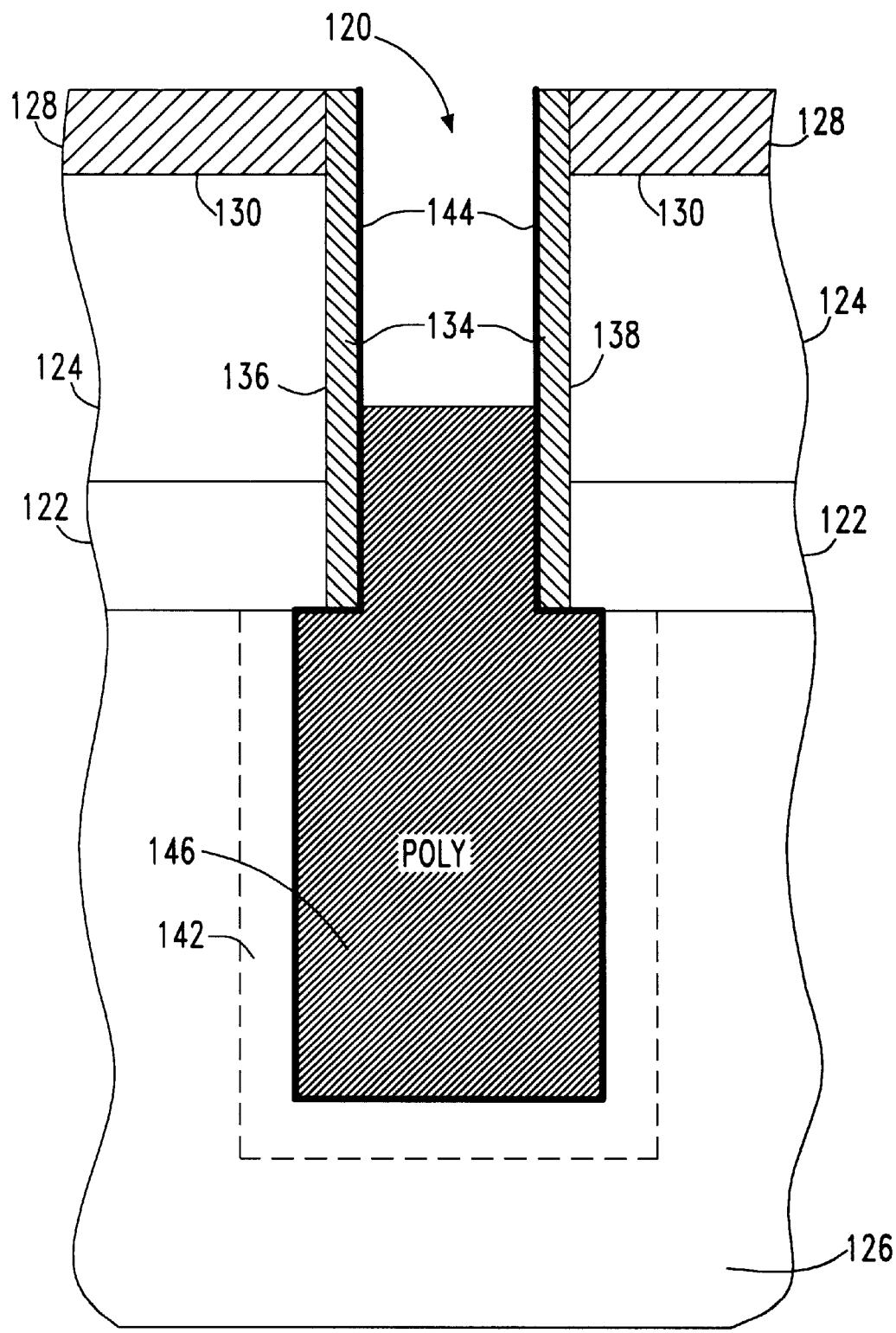

Returning to the drawings, in FIG. 2D individual cell storage capacitor plates are formed in the expanded lower region 140 in step 108. First, a thin capacitor dielectric 144 is formed on trench 120 surfaces, preferably using LPCVD SiN. The thin SiN dielectric layer 144 is preferably 3.5 nm thick and may be from 2–10 nm thick. Then, a conductive material, preferably doped polysilicon, is deposited of sufficient thickness to fill the trench 120 using LPCVD. The wafer is planarized to remove surface polysilicon. The plate is completed by recessing the polysilicon to a point just above the BOX layer 122, preferably, using a $SF_6$ plasma dry etch.

Figure 2E:
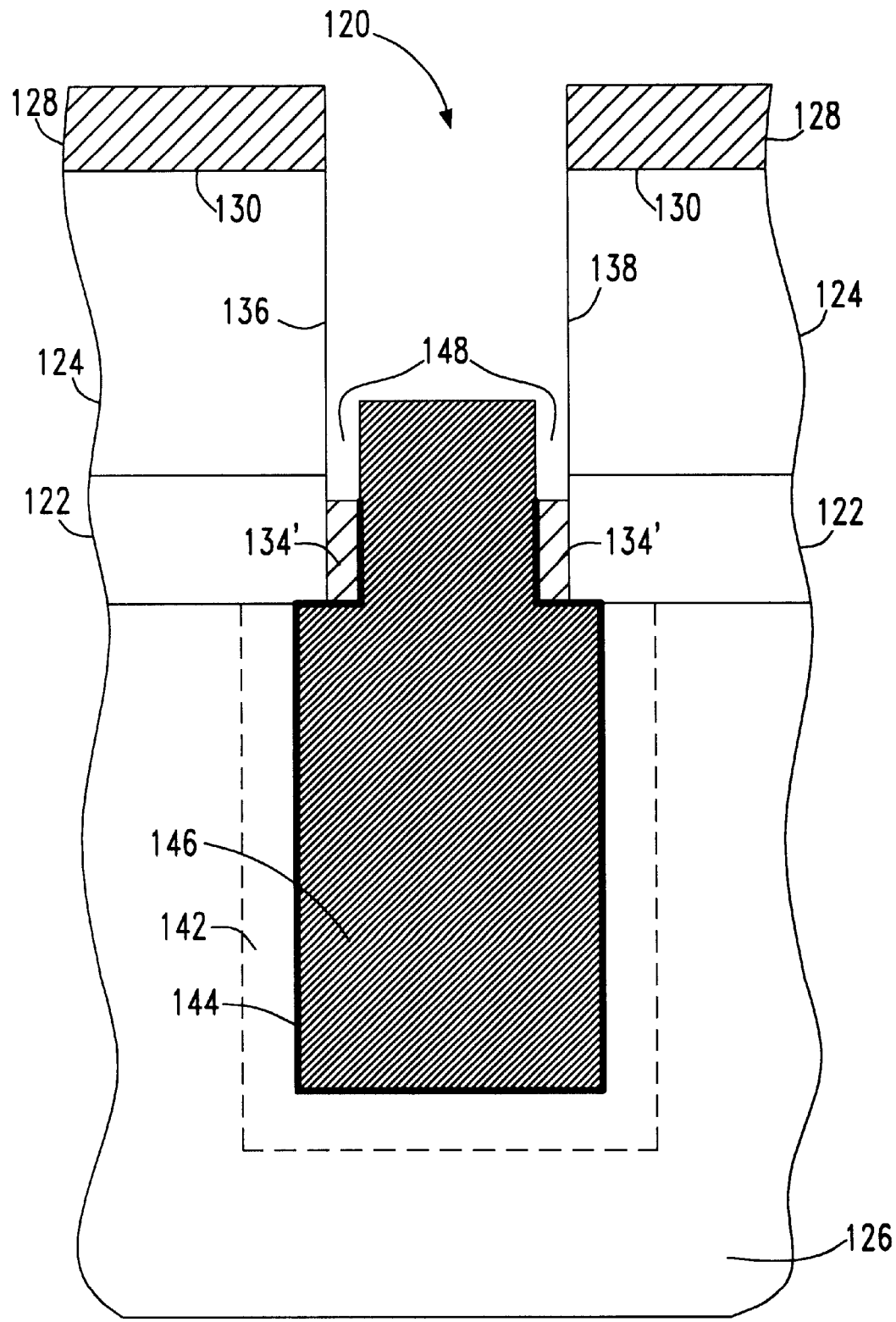

In FIG. 2E the thin SiN dielectric layer 144 is stripped and the sidewall spacer 134 is removed along the SOI layer and sub-etched beneath the polysilicon plate 146 in step 110 to form recesses 148 around the upper surface of plate 146. Protective spacers 134' remain along the BOX layer 122 sidewalls. Preferably, the sidewall spacer material is sub-etched using a wet etch such as a hydrofluoric acid solution.

Next, an interfacial treatment of a thin dielectric surface layer (not shown), such as a 1 nm oxide or nitride layer, is formed on SOT sidewalls 136, 138 and in the recesses 148 along the exposed sides of polysilicon plate 146. Preferably, the interfacial treatment is a thin nitride layer between 0.5 nm and 2 nm, preferably 1 nm, formed with a thermal nitridation. This thin dielectric, interfacial treatment layer controls and limits the extent of outdiffusion from the polysilicon plate 134 into SOI layer 124. Therefore, the thin dielectric interfacial treatment layer is not completely isolating, but is electrically conductive for electron tunneling along the side of polysilicon plate 146 and at the sidewalls 138, 136 of SOT layer 124.

Figure 2F:
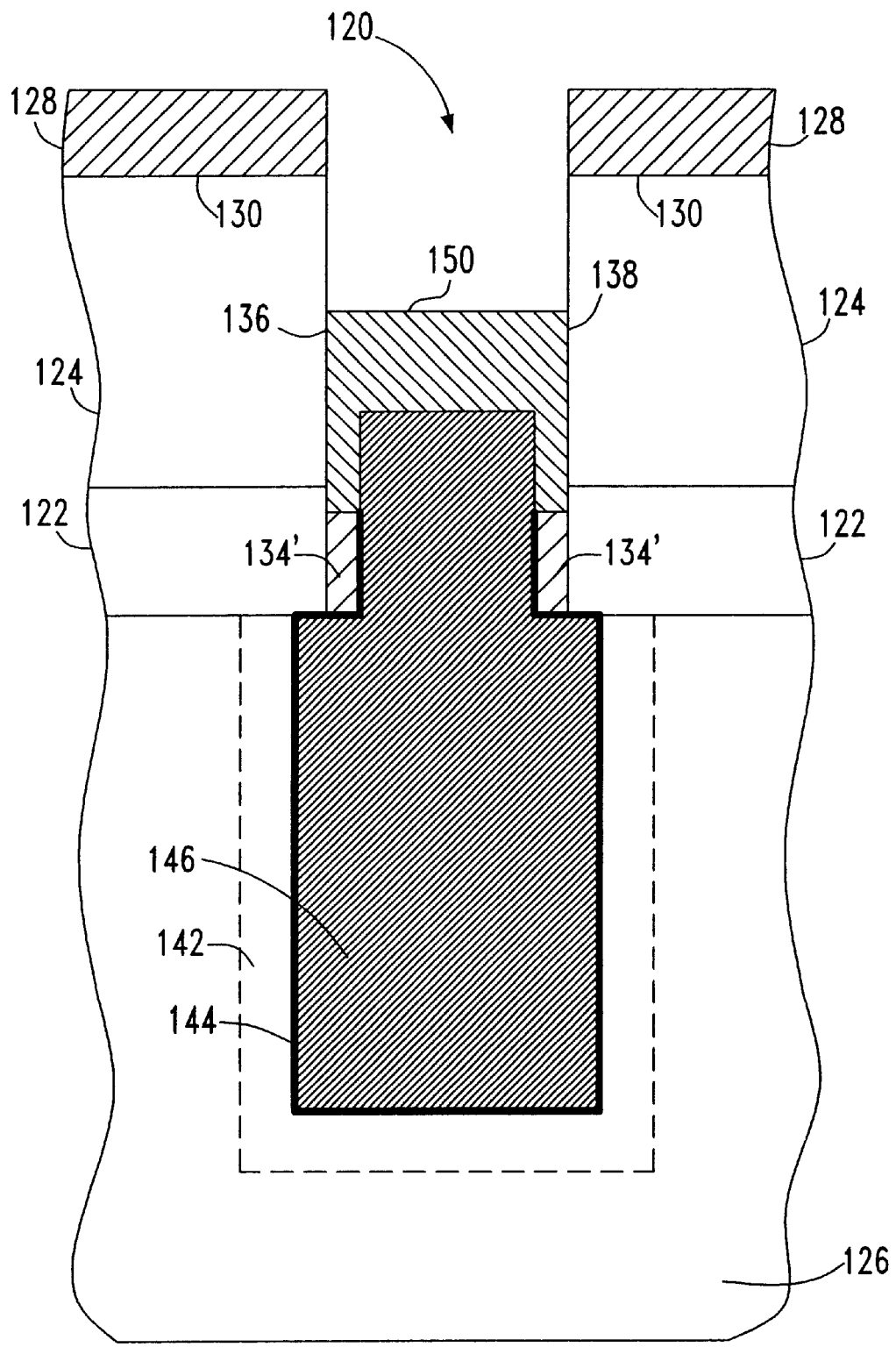

Turning to FIG. 2F, a strap layer 150 is formed in step 112. Preferably, the strap layer 150 is formed by depositing a conformal layer of heavily doped polysilicon using LPCVD. The polysilicon strap layer is 10 nm–50 nm thick, preferably 30 nm, and doped with n-type dopant. Further, the strap layer completely fills the recessed spacer region 148 above protective spacers 134'.

Figure 2G:
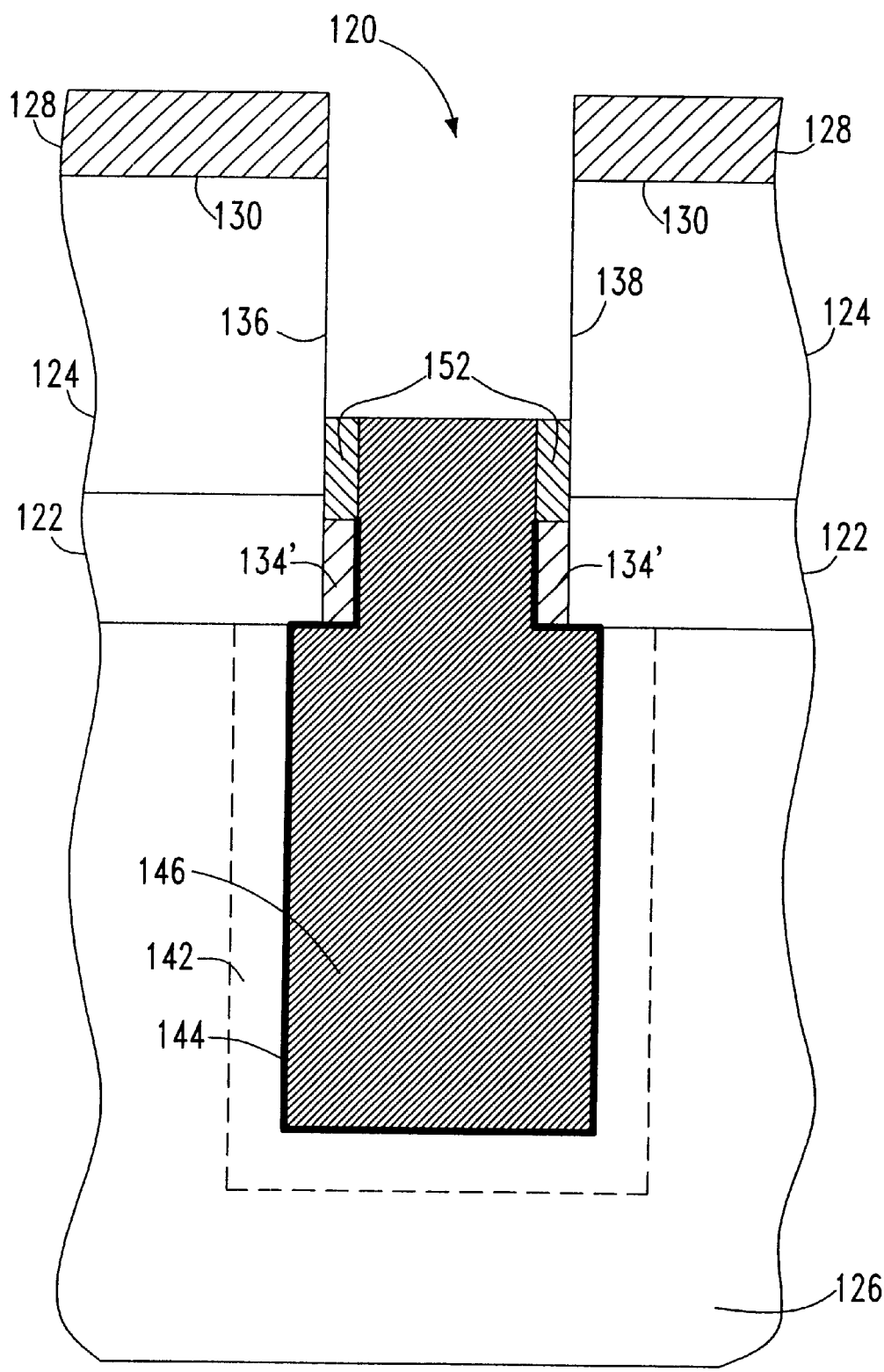

Then, as shown by the cross section of FIG. 2G, straps 152 are defined in step 114. Exposed horizontal and vertical areas of strap layer 150 are isotopically etched away to define straps 152 which strap cell capacitor plates to access transistor source regions. Polysilicon straps 152 are defined in recess area 148 using a selective wet or dry etch, selective to nitride, to remove the exposed strap layer 148 along the sidewalls 136, 138 and above the pad nitride 128. Each polysilicon strap 152 is a self-aligned buried strap that makes an electrical connection between the polysilicon plate 146 and the trench sidewalls 136, 138 of SOI layer 124 and, essentially, completes cell storage capacitor definition.

Figure 2H:
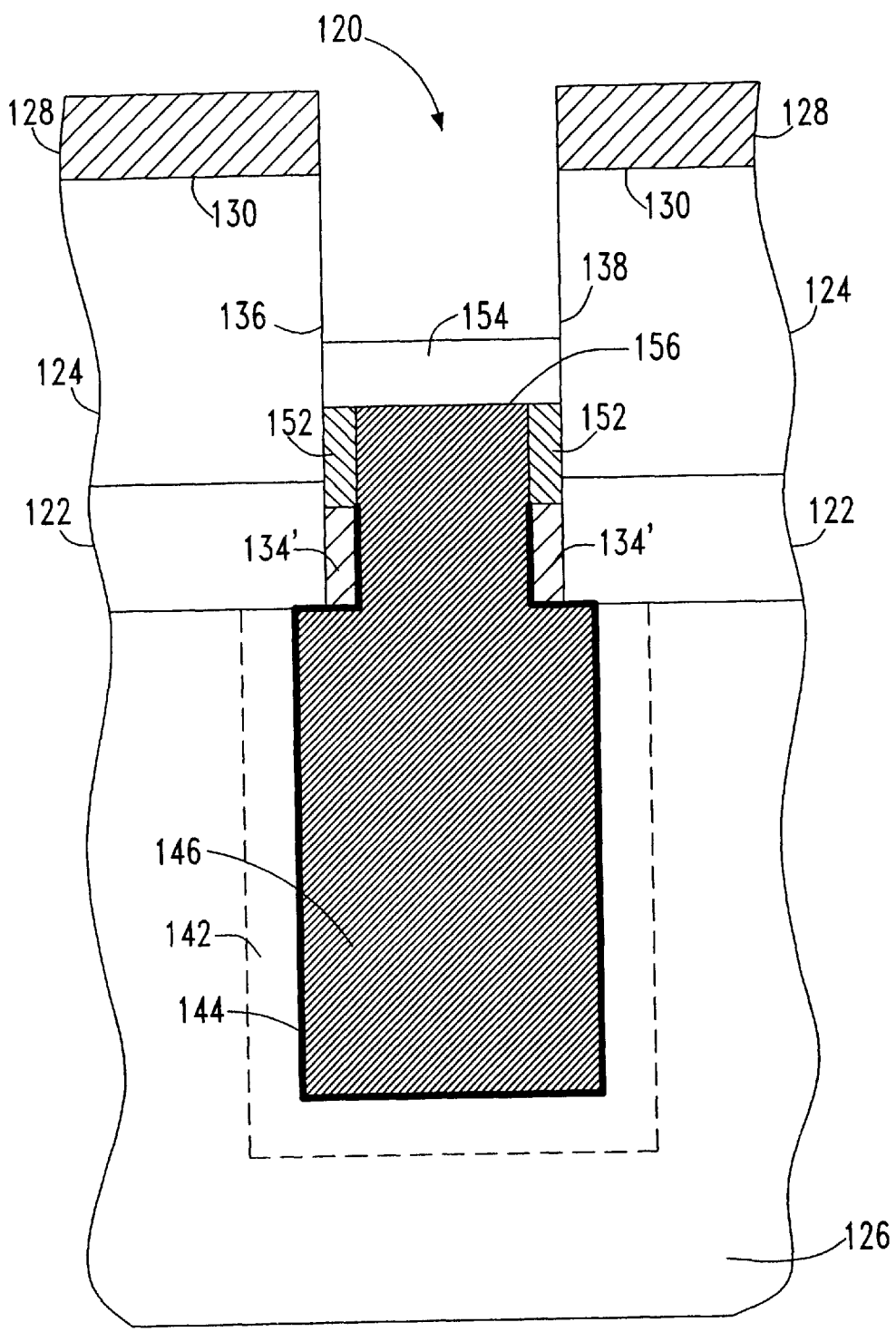

In FIG. 2H a trench-top-oxide (TTO) pad 154 is formed above the strapped polysilicon plug 146. TTO pad 154 isolates the cell storage capacitor from the cell transfer gate FET formed thereabove in step 115. So, the TTO pad 146 is formed by anisotropically depositing an oxide layer on the horizontal surfaces of the wafer, which includes the top 156 of polysilicon plates 146. Then, using a suitable chemical mechanical polishing (CMP) process, the oxide layer is removed from the pad SiN layer 128 but, remains in the trenches 120 on polysilicon plugs 146. Then, the pad nitride layer 128 is stripped away using conventional wet etch. A sacrificial thermal oxide layer is grown on the wafer to a thickness of 5 nm to 20 nm, preferably 10 nm. Primarily, the sacrificial oxide layer is formed to heal any damage to the SOI layer 124 sidewalls 136, 138 and on the surface 130 of the SOI layer 124 that may have occurred during the previous steps.

Figure 2I:
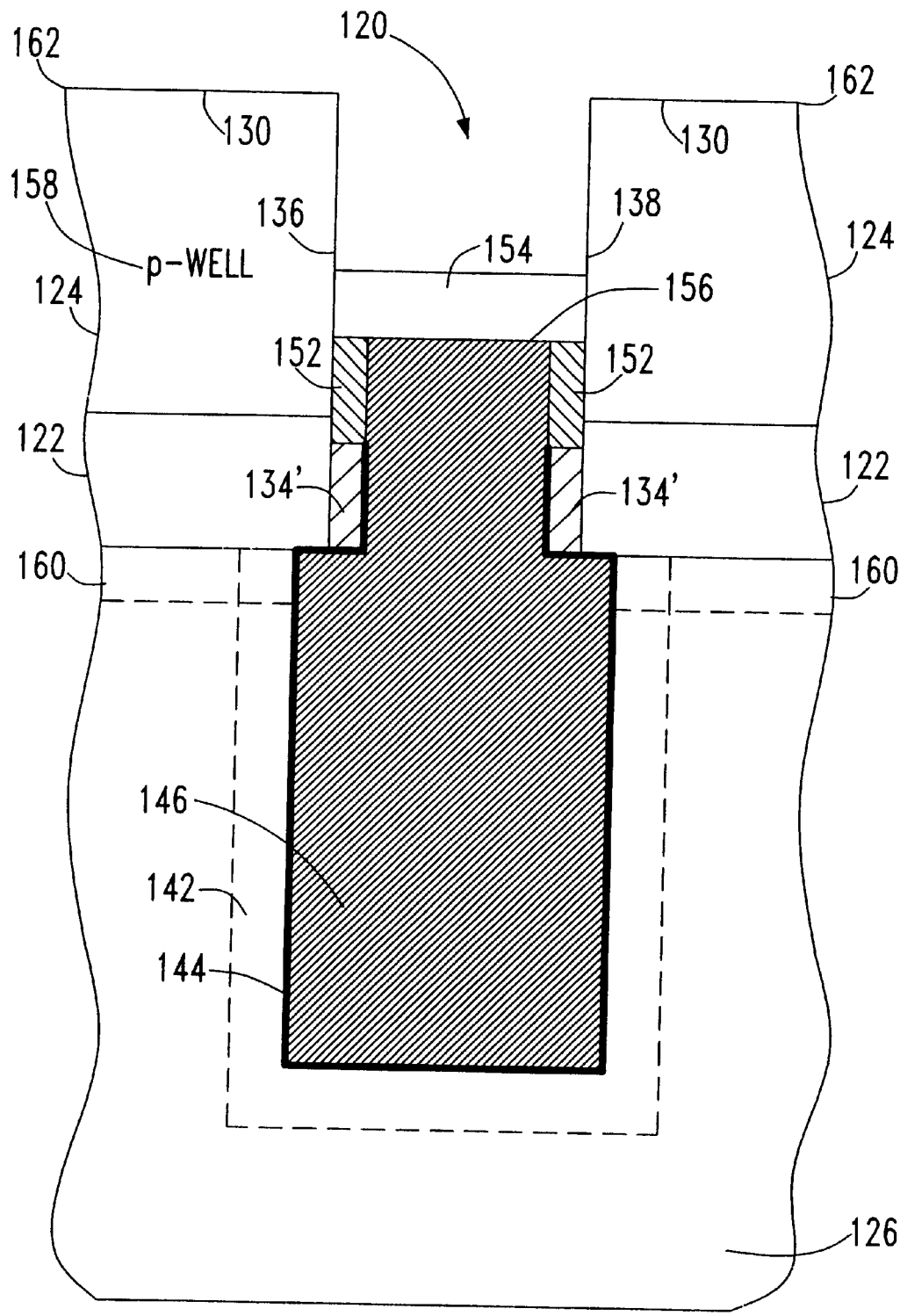

Next in step 116, as shown in FIG. 2I, device regions are defined. Device wells 158, p-wells, are defined by implanting a p-type dopant, in this example, into the wafer. The common capacitor plate diffusions 142 in adjacent array cells are connected together by a layer of an n-type dopant implanted into substrate 126 to form an n-band layer 160. Then, the sacrificial surface oxide is stripped using a HF solution, and gate oxide 162 is grown along surface 130 and on sidewalls 136, 138 using thermal oxidation. The gate oxide 162 is 2 nm to 20 nm, preferably 5 nm.

Figure 2J:
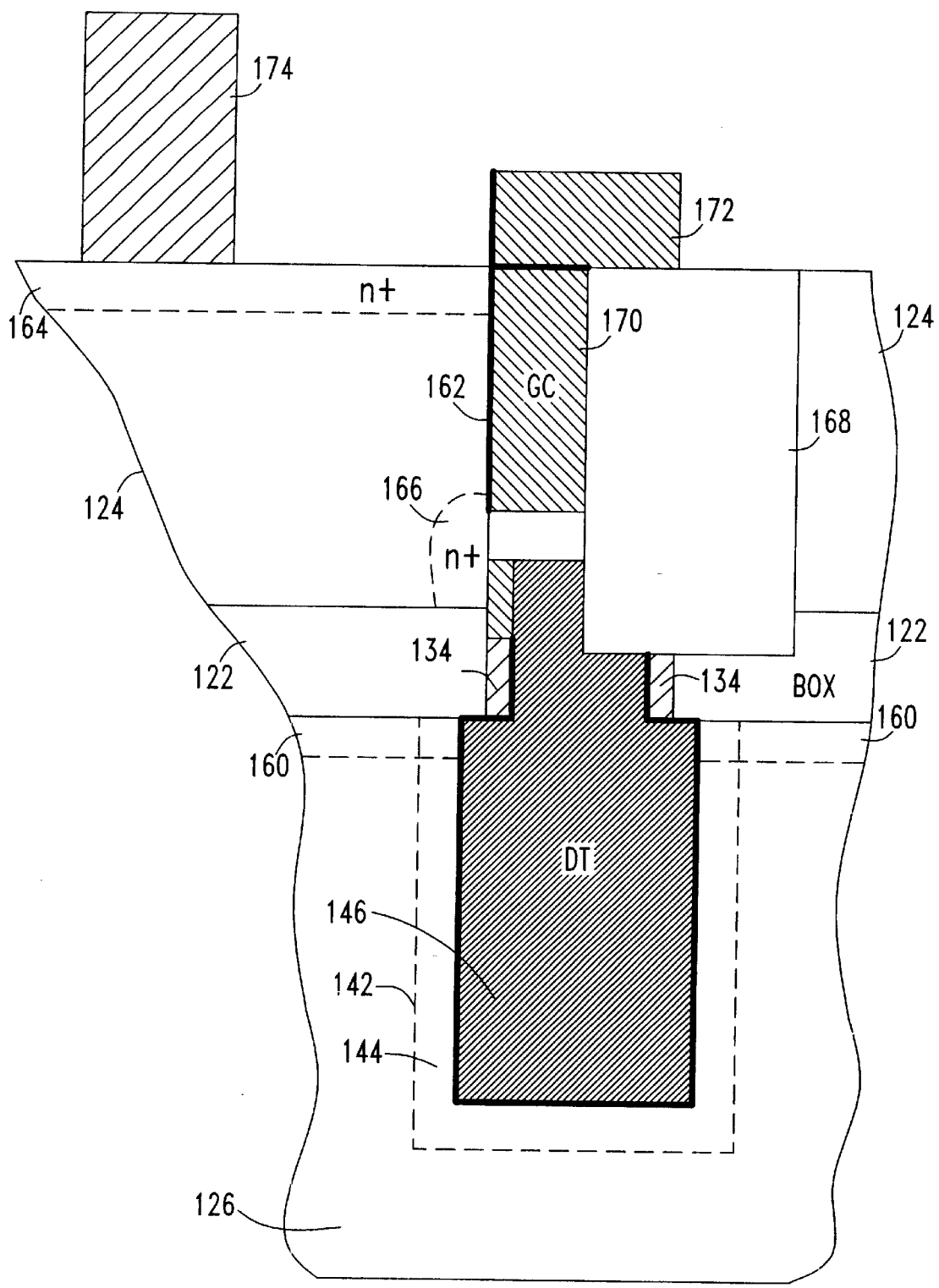

Then, a drain diffusion layer 164 in FIG. 2J, preferably n-type, is implanted and diffused into the upper is surface 130 of the SOI layer 124. During subsequent thermal processing and coincidentally with diffusing the drain diffusion layer 164, dopant outdiffuses from remaining straps 152 forming self-aligned source diffusion 166. The diffusion that forms from this outdiffusion connects the source of the cell transfer device to the cell storage capacitor plate 146.

Then, the cell's access transistor gate is formed, cells are isolated and word and bit lines are defined and formed in step 118. A layer of conductive material is deposited of sufficient thickness to fill the trenches 120, preferably, using LPCVD to deposit doped polysilicon. A protective nitride pad layer (not shown) is deposited on the polysilicon layer. Then, device isolation trenches 168 are formed using a conventional shallow trench isolation (STI) process, such as photolithography and a dry etch, e.g, RIE. The RIE-formed shallow trenches 168 remove one deep trench sidewall 138 and extend down through the SOI silicon layer 124 and partially through the BOX layer 122 and at least to the top of the protective spacer 134'. Thus, the shallow trenches 168, essentially form isolated silicon islands of the SOI layer 124 on BOX layer 122 with a polysilicon gate 170 along the remaining deep trench sidewall 136, thereby forming the cell's access transistor gate. The shallow trenches 168 are filled with insulating material such as silicon dioxide using, preferably, an anisotropic high density plasma (HDP) deposition.

Then, excess silicon dioxide is removed and the wafer surface is planarized to the protective pad SiN surface using a conventional CMP process. The protective pad SiN is stripped from the wafer using a standard wet etch. A wordline layer, preferably a polysilicon layer, is formed on the surface. The wordline layer is patterned to form wordlines (WL) 172 in contact with the access transistor gates 170 using a well known word line definition technique. A bitline contact 174 is formed at the drain diffusion layer 164 using conventional a bitline formation technique.

Figure 3:
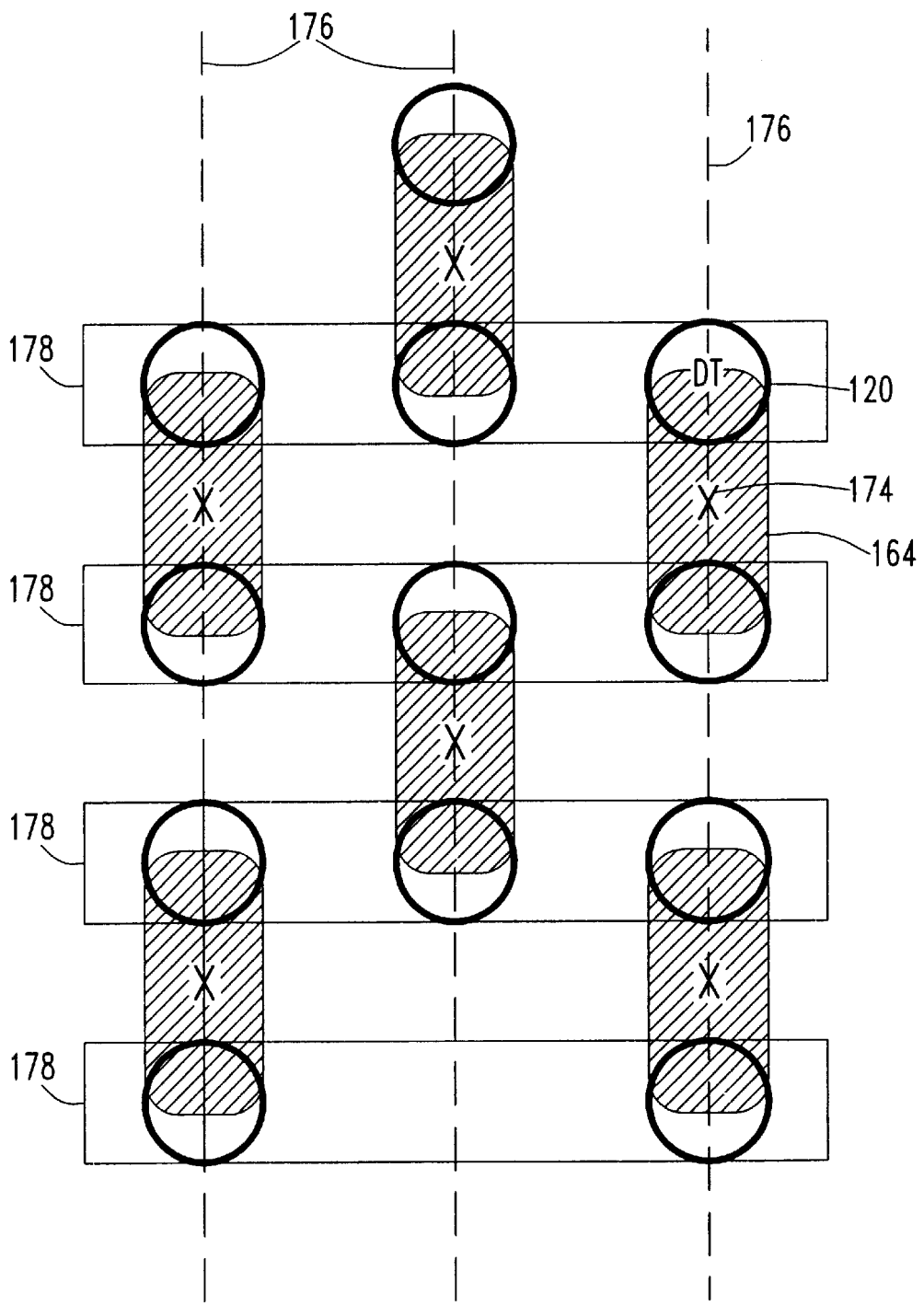
FIG. 3 shows a top-down example of a portion of a preferred embodiment memory array of SOI Vertical Array Device Trench Capacitor DRAM of FIG. 2J.

FIG. 3 shows a top-down example of a portion of a preferred embodiment memory array of SOI Vertical Array Device Trench Capacitor DRAM of FIG. 2J. The bitline (BL) diffusions 164 are shared by cell pairs at opposite sides of the SOI islands and are connected to bit line contacts 174 represented by X's. Bitlines 176 are represented by vertical dashed lines and wordlines 178 are spaced horizontally. Accordingly, the preferred embodiment cells form an array of a densely packed DRAM cell for high density, high capacity high performance DRAM chips.

It should be noted that the preferred embodiment as described herein with bitline contact 174 and bitline diffusion regions 164 being shared by two adjacent cell structures as shown in FIG. 2J. Those skilled in the art will recognize that other cell layouts, such as those that do not share bitline contacts structures 174, 164, may also be formed without departing in spirit or scope from the present invention.

While the invention has been described in terms of preferred embodiments, those skilled in the art will recognize that the invention can be practiced with modification within the spirit and scope of the appended claims.

We claim:

1. A method of forming a memory cell in a layered semiconductor wafer, said layered semiconductor wafer comprising the steps of:
    a) forming a buried oxide (BOX) layer in said layered semiconductor wafer;
    b) etching through said BOX layer to form a trench capacitor;
    c) forming a conductive strap from a plate of said trench capacitor to a trench sidewall of a top layer of said layered semiconductor wafer;
    d) forming a vertical transistor along said trench sidewall of said semiconductor layer; and
    e) forming semiconductor islands of said top semiconductor layer, said vertical transistor being one of said semiconductor islands.

2. The method of claim 1, wherein said semiconductor wafer is a silicon wafer, said BOX layer isolating the top silicon layer from a thicker silicon substrate beneath said BOX layer, and the step b) of forming a trench capacitor comprises forming a bottle shaped trench in said layered wafer, said trench capacitor being formed in said bottle shaped trench.

3. The method of claim 2, wherein forming the bottle shaped trench comprises the steps of:
    i) etching an upper portion of a first trench through said silicon layer and said BOX layer;
    ii) forming protective sidewall layer in said upper portion of said first trench; and
    iii) etching said first trench into the thicker silicon substrate.

4. The method of claim 3, wherein forming the bottle shaped trench further comprises:
    iv) expanding said trenches in said thicker silicon substrate; and
    v) forming a polysilicon plate in said bottle shaped trench.

5. The method of claim 4, wherein the step (c) of forming the conductive strap comprises:
    i) partially removing said protective sidewall layers to a point below a top of said polysilicon plate, recesses being formed between said polysilicon plate and sidewalls of said bottle shaped trench;
    ii) forming a conductive strap layer in said trenches, said conductive strap layer filling said recesses; and
    iii) selectively removing said conductive strap layer from said trenches, conductive straps remaining in said recesses.

6. The method of claim 5, wherein the step (d) of forming the vertical transistor comprises the steps of:
    i) forming an oxide layer on the polysilicon plate and said conductive strap;
    ii) forming a gate oxide layer on sidewalls of said top silicon layer;
    iii) filling said trench with gate material; and
    iv) forming a conductive region at an upper surface of said top silicon layer.

7. The method of claim 6, wherein the conductive region is a drain diffusion region and wherein when said drain diffusion region is formed dopant outdiffuses from said conductive strap into a lower portion of said top silicon layer forming a source diffusion region.

8. The method of claim 7, wherein the step (e) of forming the silicon islands comprises the steps of:
    i) forming a plurality of isolation trenches through said top silicon layer and partially through said BOX layer; and
    ii) filling said isolation trenches with insulating material.

9. A method of forming a memory array of memory cells as in claim 8, said further comprising the steps of:
    e) forming wordlines connected to a plurality of said vertical transistor gates; and
    f) forming a plurality of bitlines connected to a plurality of vertical transistor drain diffusions.

* * * * *